(12) United States Patent
Lim

(10) Patent No.: US 7,683,463 B2
(45) Date of Patent: Mar. 23, 2010

(54) ETCHED LEADFRAME STRUCTURE INCLUDING RECESSES

(75) Inventor: Lay Yeap Lim, Penang (MY)

(73) Assignee: Fairchild Semiconductor Corporation, South Portland, ME (US)

( * ) Notice: Subject to any disclaimer, the term of this patent is extended or adjusted under 35 U.S.C. 154(b) by 83 days.

(21) Appl. No.: 11/737,630

(22) Filed: Apr. 19, 2007

(65) Prior Publication Data

US 2008/0258272 A1    Oct. 23, 2008

(51) Int. Cl.
*H01L 23/495* (2006.01)

(52) U.S. Cl. .................................... 257/666

(58) Field of Classification Search ............... 257/666, 257/787, 667, 676, E23.004, E23.043, E23.05, 257/E23.059; 438/123
See application file for complete search history.

(56) References Cited

U.S. PATENT DOCUMENTS

| | | | |
|---|---|---|---|
| 4,890,153 A | 12/1989 | Wu | |
| 5,327,325 A | 7/1994 | Nicewarner, Jr. | |
| 5,646,446 A | 7/1997 | Nicewarner, Jr. | |
| 5,776,797 A | 7/1998 | Nicewarner, Jr. et al. | |
| 6,133,634 A | 10/2000 | Joshi | |
| 6,329,706 B1 | 12/2001 | Nam | |
| 6,424,035 B1 | 7/2002 | Sapp et al. | |
| 6,432,750 B2 | 8/2002 | Jeon et al. | |
| 6,449,174 B1 | 9/2002 | Elbanhawy | |
| 6,489,678 B1 | 12/2002 | Joshi | |
| 6,556,750 B2 | 4/2003 | Constantino et al. | |
| 6,566,749 B1 | 5/2003 | Joshi et al. | |
| 6,574,107 B2 | 6/2003 | Jeon et al. | |
| 6,621,152 B2 | 9/2003 | Choi et al. | |
| 6,627,991 B1 | 9/2003 | Joshi | |
| 6,630,728 B2 | 10/2003 | Glenn | |
| 6,642,738 B2 | 11/2003 | Elbanhawy | |
| 6,645,791 B2 | 11/2003 | Noquil et al. | |
| 6,674,157 B2 | 1/2004 | Lang | |
| 6,683,375 B2 | 1/2004 | Joshi et al. | |
| 6,696,321 B2 | 2/2004 | Joshi | |
| 6,720,642 B1 | 4/2004 | Joshi et al. | |
| 6,731,003 B2 | 5/2004 | Joshi et al. | |
| 6,740,541 B2 | 5/2004 | Rajeev | |
| 6,756,689 B2 | 6/2004 | Nam et al. | |
| 6,774,465 B2 | 8/2004 | Lee et al. | |
| 6,777,800 B2 | 8/2004 | Madrid et al. | |
| 6,806,580 B2 | 10/2004 | Joshi et al. | |
| 6,830,959 B2 | 12/2004 | Estacio | |
| 6,836,023 B2 | 12/2004 | Joshi et al. | |
| 6,867,481 B2 | 3/2005 | Joshi et al. | |
| 6,867,489 B1 | 3/2005 | Estacio | |
| 6,891,256 B2 | 5/2005 | Joshi et al. | |
| 6,891,257 B2 | 5/2005 | Chong et al. | |
| 6,893,901 B2 | 5/2005 | Madrid | |
| 6,943,434 B2 | 9/2005 | Tangpuz et al. | |
| 6,989,588 B2 | 1/2006 | Quinones et al. | |
| 6,992,384 B2 | 1/2006 | Joshi | |
| 7,022,548 B2 | 4/2006 | Joshi et al. | |
| 7,023,077 B2 | 4/2006 | Madrid | |

(Continued)

*Primary Examiner*—Thao P. Le
(74) *Attorney, Agent, or Firm*—Townsend and Townsend and Crew LLP

(57) ABSTRACT

A leadframe structure is disclosed. The leadframe structure includes a first leadframe structure portion with a first thin portion and a first thick portion, where the first thin portion is defined in part by a first recess. It also includes a second leadframe structure portion with a second thin portion and a second thick portion, where the second thin portion is defined in part by a second recess. The first thin portion faces the second recess, and the second thin portion faces the first recess.

27 Claims, 7 Drawing Sheets

U.S. PATENT DOCUMENTS

| | | |
|---|---|---|
| 7,045,396 B2 * | 5/2006 | Crowley et al. .............. 438/123 |
| 7,061,077 B2 | 6/2006 | Joshi |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,196,313 B2 | 3/2007 | Quinines et al. |
| 7,199,461 B2 * | 4/2007 | Son et al. .................... 257/692 |
| 7,208,819 B2 | 4/2007 | Jeun et al. |
| 7,215,011 B2 | 5/2007 | Joshi et al. |
| 7,217,594 B2 | 5/2007 | Manatad |
| 2003/0197290 A1 * | 10/2003 | Crowley et al. .............. 257/787 |
| 2003/0201520 A1 * | 10/2003 | Knapp et al. ................. 257/666 |
| 2004/0041242 A1 * | 3/2004 | Joshi .......................... 257/666 |
| 2005/0062148 A1 * | 3/2005 | Seo et al. .................... 257/712 |
| 2005/0285235 A1 * | 12/2005 | Carney et al. ............... 257/666 |
| 2006/0006504 A1 * | 1/2006 | Lee et al. .................... 257/666 |
| 2006/0076660 A1 * | 4/2006 | Boschlin et al. ............. 257/678 |
| 2006/0151858 A1 * | 7/2006 | Ahn et al. ................... 257/666 |
| 2007/0246838 A1 * | 10/2007 | Hoeglauer et al. .......... 257/781 |
| 2008/0087991 A1 * | 4/2008 | Cheah et al. ................ 257/666 |
| 2008/0173991 A1 * | 7/2008 | Cruz et al. .................. 257/676 |

* cited by examiner

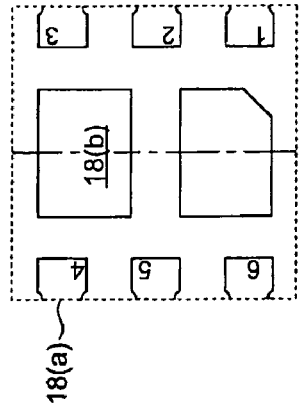
PRIOR ART
FIG. 3(b)
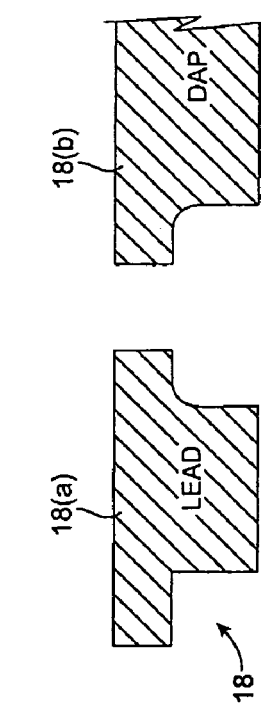
PRIOR ART
FIG. 3(a)
FIG. 4(b)
FIG. 4(a)

UV Light

ETCHED LEADFRAME STRUCTURE INCLUDING RECESSES

CROSS-REFERENCES TO RELATED APPLICATIONS

NOT APPLICABLE

BACKGROUND

A typical semiconductor die package comprises a leadframe structure, a semiconductor die mounted on a die attach pad of the leadframe structure, and a molding material. The leadframe structure is typically etched with recesses so that the molding material locks to the leadframe structure. In the conventional leadframe structure, the etched recesses face each other. An example of this is shown in FIG. 2(a).

Such conventional semiconductor die packages are useful. However, it would be desirable to either reduce the size of a semiconductor die package or increase the size of the die attach pad. By making a semiconductor die package smaller, the semiconductor die package can be used in smaller electronic devices. By increasing the size of a die attach pad, a larger semiconductor die can be used. If the semiconductor die comprises a power transistor, the larger semiconductor die can have a higher current rating than a smaller semiconductor die.

Embodiments of the invention address these problems, individually and collectively.

BRIEF SUMMARY

Embodiments of the invention are directed to leadframe structures, semiconductor die packages including the leadframe structures, and methods for making the leadframe structures and the semiconductor die packages.

One embodiment of the invention is directed to a leadframe structure comprising a first leadframe structure portion comprising a first thin portion and a first thick portion. The first thin portion is defined in part by a first recess. The leadframe structure also comprises a second leadframe structure portion comprising a second thin portion and a second thick portion. The second thin portion is defined in part by a second recess. The first thin portion faces the second recess, and the second thin portion faces the first recess.

Another embodiment of the invention is directed to a semiconductor die package comprising a leadframe structure comprising a first leadframe structure portion comprising a first thin portion and a first thick portion. The first thin portion is defined in part by a first recess, and the first leadframe structure portion is a lead. The leadframe structure has a second leadframe structure portion comprising a second thin portion and a second thick portion. The second thin portion is defined in part by a second recess. The second leadframe structure portion is a die attach pad. The first thin portion faces the second recess, and the second thin portion faces the first recess. A semiconductor die is on the die attach pad, and a molding material is formed around at least part of the leadframe structure and the semiconductor die.

Yet another embodiment of the invention is directed to a method comprising obtaining a leadframe structure precursor including a first leadframe structure precursor portion and a second leadframe structure precursor portion, forming a first recess in the first leadframe structure precursor portion, whereby the first leadframe structure precursor portion thereafter has a first thick portion and a first thin portion, and forming a second recess in the second leadframe structure precursor portion. The second leadframe structure precursor portion thereafter has a second thick portion and a first thin portion. The first thin portion faces the second recess, and the second thin portion faces the first recess in the formed leadframe structure.

Yet another embodiment of the invention is directed to a method for forming a semiconductor die package. The method comprises forming a leadframe structure according to the method described above, and attaching a semiconductor die to the second leadframe structure portion. A molding material may also be molded around the leadframe structure and the semiconductor die.

These and other embodiments of the invention are described in further detail below.

BRIEF DESCRIPTION OF THE DRAWINGS

FIG. 3(a) shows a side, cross-sectional view of a portion of a conventional leadframe structure.

FIG. 3(b) shows a top plan view of a conventional leadframe structure.

FIG. 4(a) shows a side, cross-sectional view of a portion of a leadframe structure according to an embodiment of the invention.

FIG. 4(b) shows a top plan view of a leadframe structure according to an embodiment of the invention.

In the drawings, like numerals designated like elements, and the descriptions of like elements may or may not be repeated.

DETAILED DESCRIPTION

A leadframe structure is disclosed. The leadframe structure includes a first leadframe structure portion with a first thin portion and a first thick portion, where the first thin portion is defined in part by a first recess. It also includes a second leadframe structure portion with a second thin portion and a second thick portion, where the second thin portion is defined in part by a second recess. The first thin portion faces the second recess, and the second thin portion faces the first recess.

Figure 1:
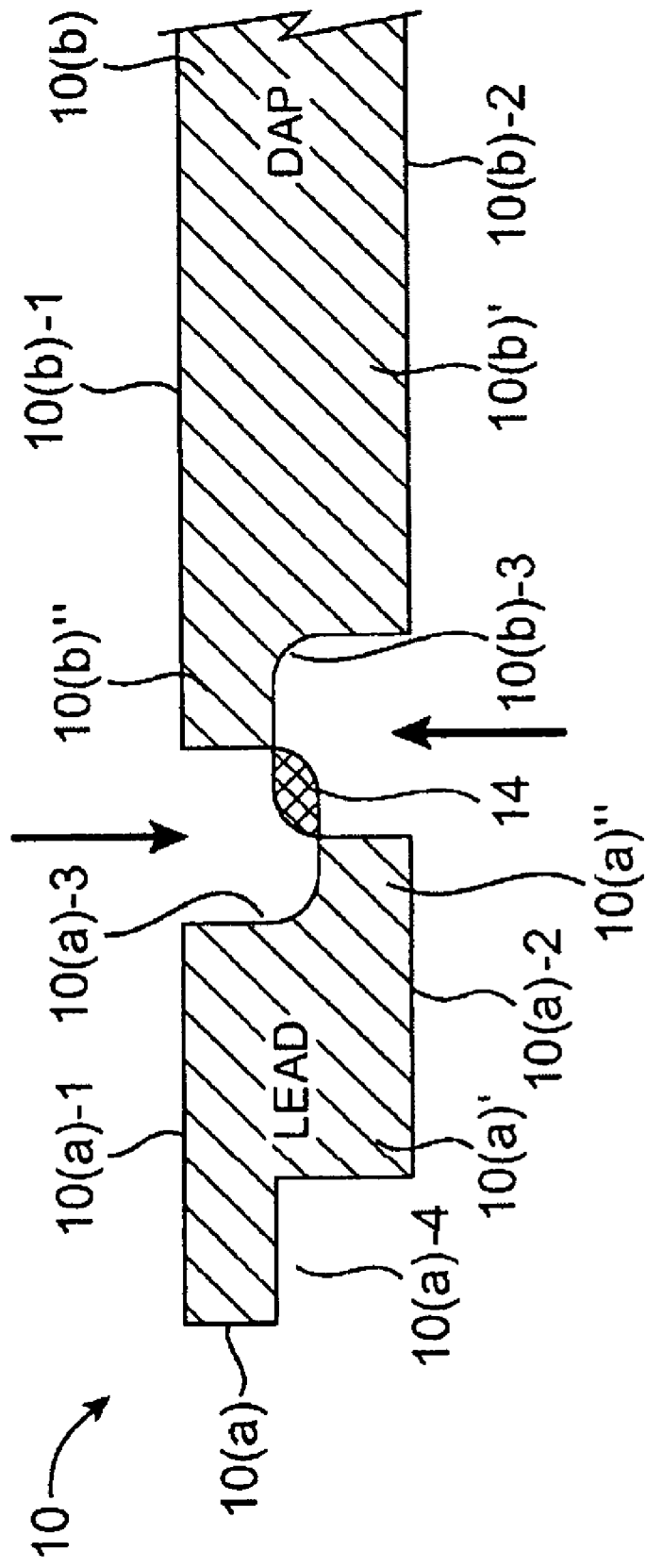
FIG. 1 shows a side, cross-sectional view of a portion of a leadframe structure according to an embodiment of the invention.

FIG. 1 shows part of a leadframe structure 10 comprising a first leadframe structure portion 10(a) and a second leadframe structure portion 10(b) separated from each other by a gap 14. The gap 14 is preferably at least about 6 mils in some embodiments of the invention.

The first leadframe structure portion 10(a) may be a lead such as a gate or a source lead, while the second leadframe structure portion 10(b) may comprise a die attach pad for supporting a semiconductor die (not shown). The second leadframe structure portion 10(b) may also comprise a drain lead. The gap 14 electrically isolates the first and second leadframe structure portions 10(*a*), 10(*b*) from each other.

The first leadframe structure portion 10(*a*) comprises a first surface 10(*a*)-1 and a second surface 10(*a*)-2 opposite the first surface 10(*a*)-1. The first surface 10(*a*)-1 may be connected to a conductive wire or clip, which is in turn connected to a semiconductor die (not shown) that would be mounted on a first surface 10(*b*)-1 of the second leadframe structure portion 10(*b*). The first surface 10(*b*)-1 may be a die attach pad, and may receive a semiconductor die.

The first leadframe structure portion 10(*b*) also comprises a first inner recess 10(*a*)-3 and an outer recess 10(*a*)-4. It also includes a first thick portion 10(*a*)' and a first thin portion 10(*a*)'' that is defined in part by the inner recess 10(*a*)-3. The thickness of the first thin portion 10(*a*)'' may be less than about 50% of the thickness of the first thick portion 10(*a*)'. In preferred embodiments, the thickness of the first thin portion 10(*a*)'' is between about 20-50% of the thickness of the first thick portion 10(*a*)'. Also, the length of the first thin portion 10(*a*)'' may be less than about 20, or even 12 mils in embodiments of the invention. The length of the first thin portion 10(*a*)'' may also be greater than about 1 mil in some embodiments.

The second leadframe structure portion 10(*b*) comprises a first surface 10(*b*)-1 and a second surface 10(*b*)-2 opposite the first surface 10(*b*)-1. The second leadframe structure portion 10(*b*) also comprises a second inner recess 10(*b*)-3. It also includes a second thick portion 10(*b*)' and a second thin portion 10(*b*)'' that is defined in part by the inner recess 10(*b*)-3. The thickness of the first thin portion 10(*b*)'' may be less than about 50% of the thickness of the first thick portion 10(*b*)'. In preferred embodiments, the thickness of the first thin portion 10(*b*)'' is between about 20-50% of the thickness of the first thick portion 10(*b*)'. Also, the length of the second thin portion 10(*b*)'' (or "overhang") may be less than about 20, or even 12 mils in embodiments of the invention. The length of the second thin portion 10(*b*)'' may also be greater than about 1 mil in some embodiments.

As shown in FIG. 1, the first thin portion 10(*a*)'' of the first leadframe structure portion 10(*a*) faces (e.g., in a horizontal direction parallel to the surfaces 10(*a*)-1 and 10(*b*)-1) the second inner recess 10(*b*)-3 of the second leadframe structure portion 10(*b*). The second thin portion 10(*b*)'' of the second leadframe structure portion 10(*b*) faces (e.g., in a horizontal direction parallel to the surfaces 10(*a*)-1 and 10(*b*)-1) the first inner recess 10(*a*)-3 of the first leadframe structure portion 10(*a*). As is apparent from FIG. 1, this configuration allows the first leadframe structure portion 10(*a*) and the second leadframe structure portion 10(*b*) to be closer to each other than they could otherwise be. Although the example in FIG. 1 shows the first thin portion 10(*a*)'' in the first leadframe structure portion 10(*a*) being in a non-overlapping position with respect to the second thin portion 10(*b*)'' in the second leadframe structure portion 10(*b*)'', in other embodiments the first and second thin portions 10(*a*)'' and 10(*b*)'' could vertically overlap and could still be electrically isolated from each other. This allows the die attach pad of the second leadframe structure portion 10(*b*) to be larger than it would otherwise be.

The die attach pad in the second leadframe structure portion 10(*b*) may optionally include a number of apertures (not shown). Like the recesses 10(*a*)-3, 10(*b*)-3, 10(*a*)-4, they can be used to lock the leadframe structure 10 to a molding material (not shown).

If desired, the leadframe structure 10 can be coated with one or more layers of material. For example, the leadframe structure 10 may include a base metal such as copper or a copper alloy. The base metal may be coated with one or more underbump metallurgy layers. For example, NiPd may be pre-plated on a copper leadframe structure. The total thickness of the leadframe structure can vary. For example, in some embodiments, the thickness of the leadframe structure can be about 8 mils thick (or more or less than this).

Figure 2A:
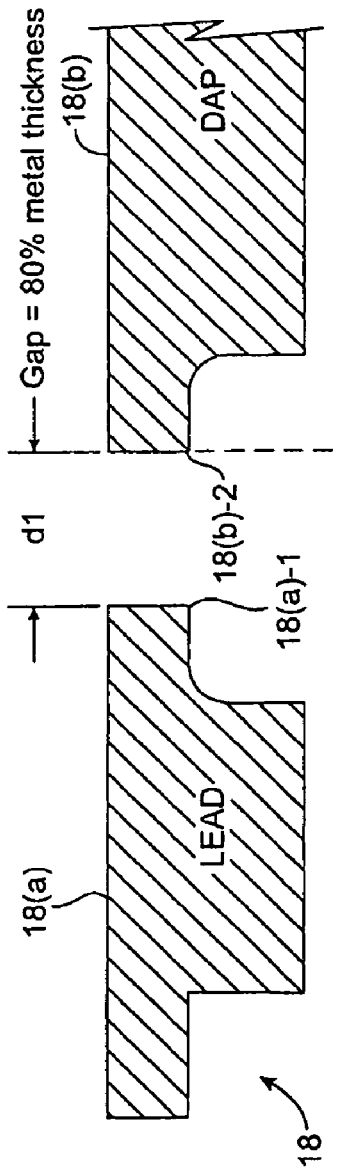
FIG. 2(a) shows a side, cross-sectional view of a portion of a conventional leadframe structure.
Figure 2B:
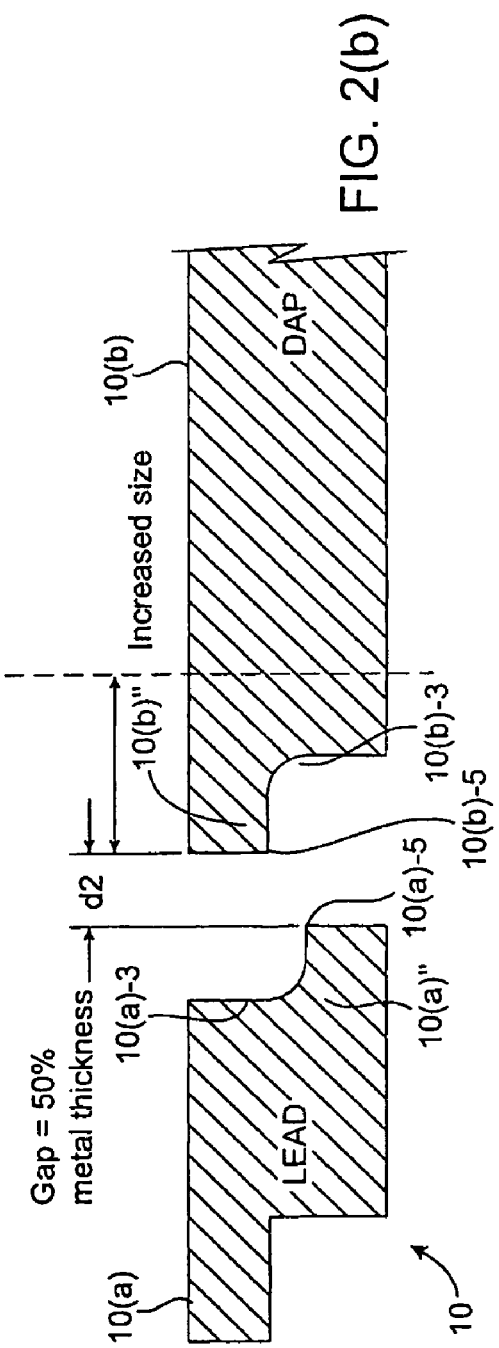
FIG. 2(b) shows a side, cross-sectional view of a portion of a leadframe structure according to an embodiment of the invention.

FIG. 2(*a*) shows a conventional leadframe structure 18 including a first leadframe structure portion 18(*a*) and a second leadframe structure portion 18(*b*). As shown, first and second thin portions 18(*a*)-1 and 18(*b*)-2 face each other. Consequently, the minimum spacing may be d1, and the gap may be 80% of the thickness of the leadframe structure 18.

In comparison, FIG. 2(*b*) shows a leadframe structure 10 according to an embodiment of the invention. It includes a first leadframe structure portion 10(*a*) and a second leadframe structure portion 10(*b*) as described above. As shown in FIG. 2(*b*), the spacing between points 10(*a*)-5 and 10(*b*)-5 of the first and second leadframe structure portions 10(*a*), 10(*b*), respectively, can be decreased in comparison to the leadframe structure 10 in FIG. 2(*a*). Compare, for example, the spacing d1 in FIG. 2(*a*) to the spacing d2 in FIG. 2(*b*). This particular configuration allows one to increase the size of the DAP (die attach paddle) in the second leadframe structure portion 10(*b*), or allows one to make a smaller semiconductor die package.

FIGS. 3(*a*) and 3(*b*) respectively show a part of a conventional leadframe structure and a top plan view of the leadframe structure 18.

FIGS. 4(*a*) and 4(*b*) respectively show a part of a leadframe structure 10 according to an embodiment of the invention and a top plan view of the leadframe structure 10.

Comparing FIGS. 3(*a*) and 3(*b*), the die attach pad in the second leadframe structure portion 10(*b*) in FIG. 4(*a*) is larger than the die attach pad in the second leadframe structure portion 18(*b*) shown in FIG. 3(*a*). The relative die attach pad sizes are also shown in FIGS. 3(*b*) and 4(*b*), which respectively show plan views of the conventional leadframe structure and the leadframe structure according to an embodiment of the invention.

Figure 5A:
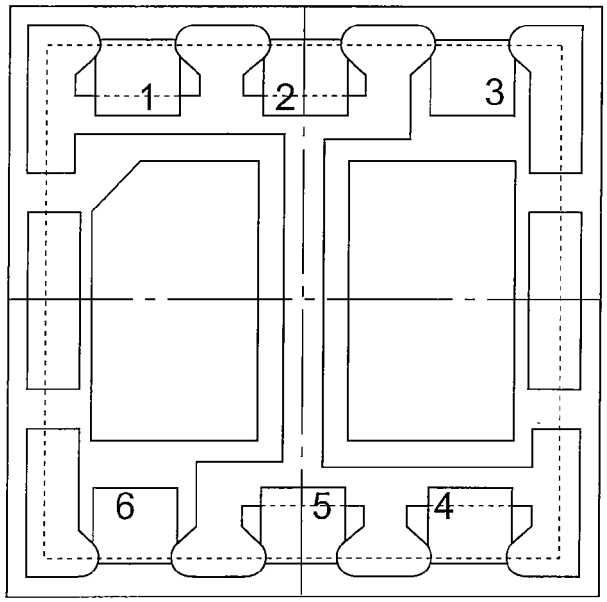
FIGS. 5(a)-5(c) respectively show bottom, top, and side views of a leadframe structure.
Figure 5B:
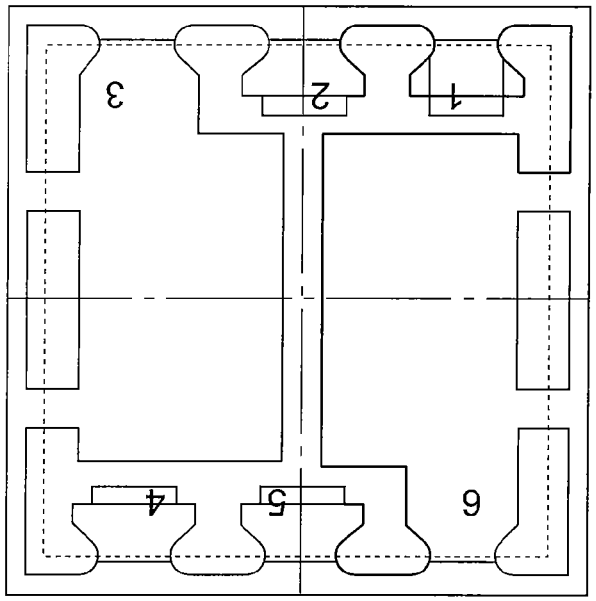
Figure 5C:
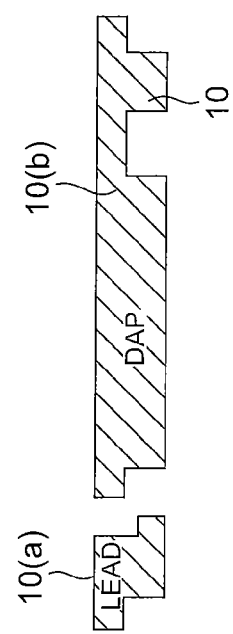

FIGS. 5(*a*)-5(*b*) respectively show bottom and top plan views of a leadframe structure 10. FIG. 5(*c*) shows a side, cross-sectional view of the leadframe structure 10 shown in FIGS. 5(*a*)-5(*b*).

A method for making the above-described leadframe structure 10 can be described with reference to FIGS. 6(*a*)-6(*e*).

FIG. 6(*a*) shows a copper frame 112 (i.e., an example of a leadframe structure precursor) coated on both sides with photoresist layers 104. The copper frame 112 may be obtained in any suitable manner (e.g., stamping, etching, etc.). Also, any suitable photoresist material (e.g., a negative photoresist) and any suitable photoresist deposition process (e.g., spin coating, roller coating, etc.) can be used to form the photoresist layers 104.

FIG. 6(*b*) shows the photoresist layers 104 being exposed with light 108 through masks 106. The masks 106 include light transmissive areas 110 through which light can pass to irradiate the photoresist 104, as well as opaque areas where light cannot pass through. The exposed regions 102 in the photoresist layers 104 correspond to the light transmissive areas 110 in the masks 106. The exposed regions 102 may thereafter be rendered soluble in a developing solution or material.

FIG. 6(*c*) shows the photoresist layers 104 after they have been developed. As shown, gaps 114 are shown where the photoresist layers 104 are developed.

FIG. 6(*d*) shows how etching can be used to etch the copper frame to form a leadframe structure 10. Any suitable etching process can be used in embodiments of the invention. For example, conventional wet or dry etching processes can be used in embodiments of the invention. Etching may form u-grooves or recesses on both sides of the copper frame, simultaneously or sequentially. Preferably, the etching depth is greater than 50% (e.g., 60%) of the thickness of the copper frame.

Figure 6A:
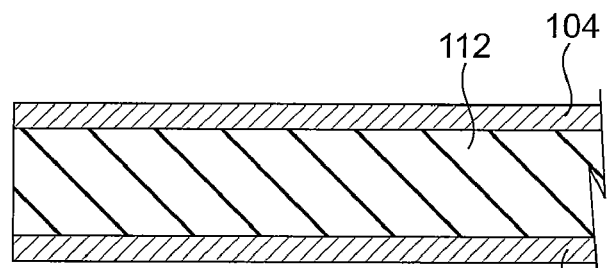
FIGS. 6(a)-6(e) show process steps that can be used in forming a leadframe structure according to an embodiment of the invention.
Figure 6B:
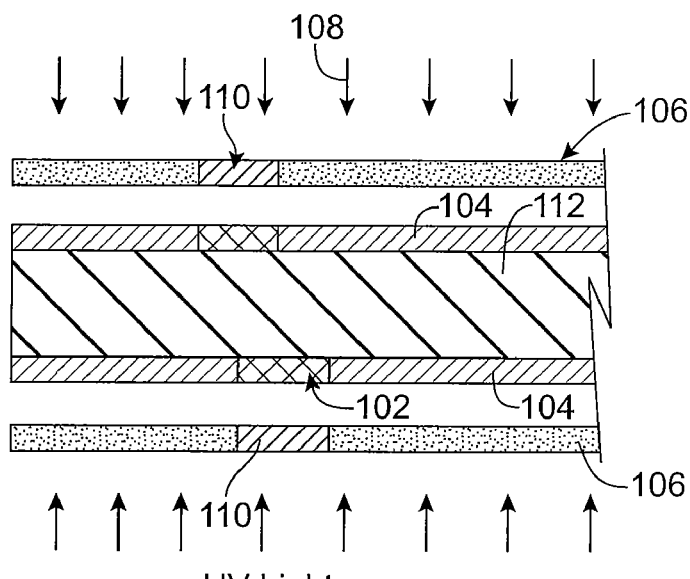
Figure 6C:
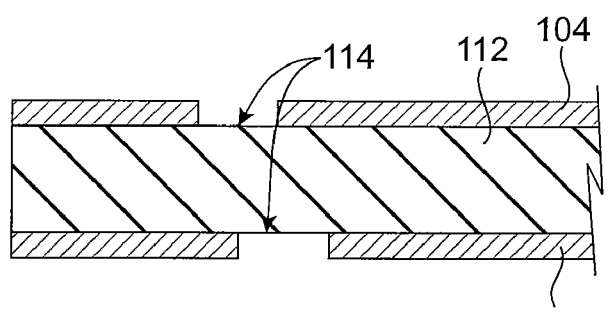
Figure 6D:
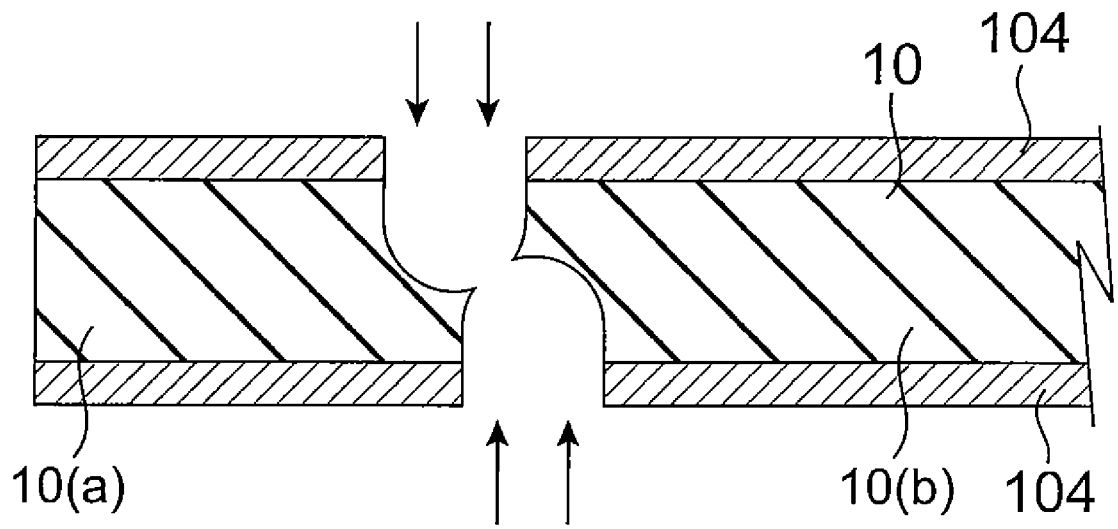
Figure 6E:
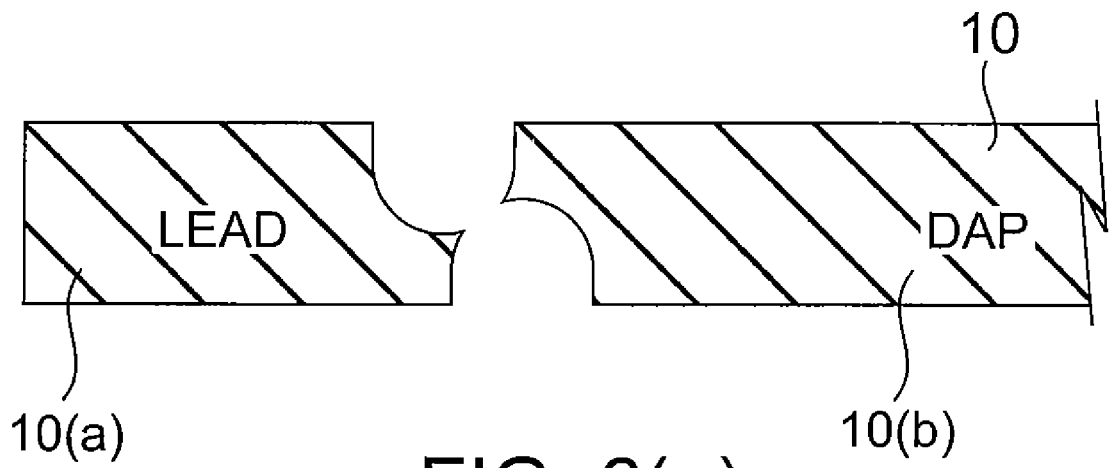

FIG. 6(e) shows the leadframe structure 10 with its first and second leadframe structure portions 10(a), 10(b) after the photoresist layers 104 have been stripped. Any suitable stripping solution may be used to strip the photoresist layers 104 from the leadframe structure.

After the leadframe structure 10 is formed, it may be optionally plated, as described above, to form a plated leadframe structure. The leadframe structure 10 can thereafter be used to support a semiconductor die in a semiconductor die package.

Figure 7:
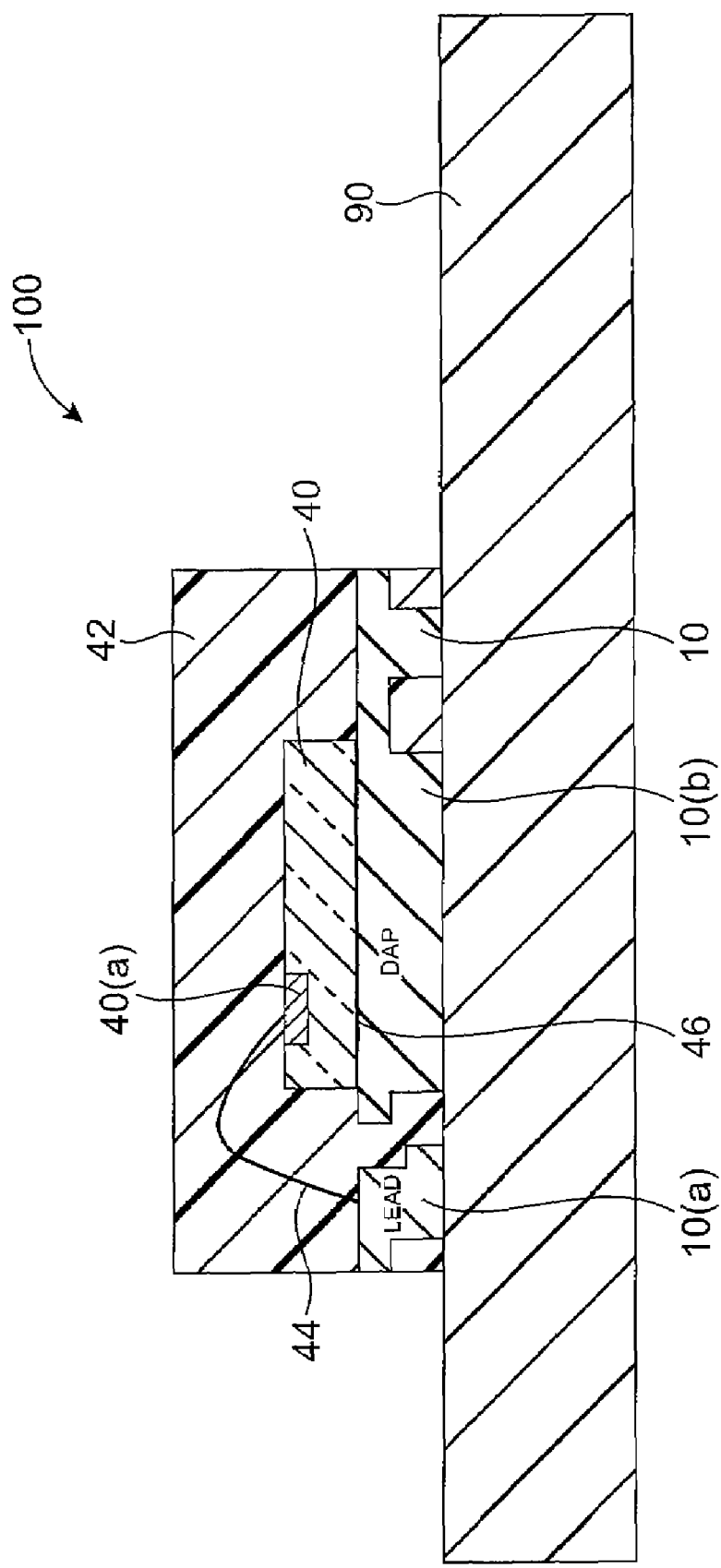
FIG. 7 shows a side, cross-sectional view of a semiconductor die package.

FIG. 7 shows a semiconductor die package 100 comprising the previously described leadframe structure 10 with a semiconductor die 40 mounted on the second leadframe structure portion 10(b). Solder or some other adhesive material may be used to mount the semiconductor die 40 to the second leadframe structure portion 10(b). The semiconductor die 40 may include a contact region 40(a) (e.g., a source region, or gate region in a MOSFET), which may be wirebonded with a wire 44 to the first leadframe structure portion 10(a). As shown, the second leadframe structure portion 10(b) may comprise a die attach pad and one or more output leads (e.g., drain leads), and the first leadframe structure portion 10(a) may comprise one or more input leads (e.g., source or drain leads). The bottom of the die 40 may be electrically coupled to the second leadframe structure portion 10(b), while the top of the die 40 may be electrically coupled to the first leadframe structure portion 10(a).

A molding material 42 may be formed around at least a portion of the leadframe structure 10 and the semiconductor die 40. The molding material 42 may comprise an epoxy based molding material or other suitable molding material. A conventional molding process can be used to shape the molding material 42.

The semiconductor die package 100 may be in the form of an MLP (microlead package) or a leaded package. FIG. 7 shows an MLP type package where the leads in the leadframe structure 10 do not extend past the lateral surfaces of the molding material 42. The bottom and the lateral surfaces of the leadframe structure 10 may be substantially coplanar with adjacent molding material surfaces in the semiconductor die package 100.

The semiconductor dies used in the semiconductor die packages according to preferred embodiments of the invention include vertical power transistors. Exemplary vertical power transistors are described, for example, in U.S. Pat. Nos. 6,274,905 and 6,351,018, both of which are assigned to the same assignee as the present application, and both which are herein incorporated by reference in their entirety for all purposes. Vertical power transistors include VDMOS transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. Other types of devices may simply have an input at one surface of the die and an output at the other opposite surface of the die. Other suitable vertical devices may include diodes.

As shown in FIG. 7, the semiconductor die package 100 may be mounted to a circuit substrate 90 (e.g., a circuit board) to form an electrical assembly. Electrical assemblies may include wireless phone systems, laptop computers, server computers, power supplies, etc.

Embodiments of the invention have a number of advantages. For example, a leadframe structure with offset top and bottom partially etched regions can create openings of at least 50% of the material thickness for good metal to metal clearance between adjacent leadframe structure portions. This allows for larger die attach pad sizes that are achievable compared to conventional leadframe structures while maintaining the same footprint and package size. This allows one to provide a larger die in a smaller semiconductor die package. Also, a larger die attach pad improves manufacturability as there is more room to attach a die, as the distance between the die attach pad edge and the die edge is increased.

Also, by providing a larger die attach pad, for discrete devices, this can result in an improved RDSon performance as a larger die can be used. Calculations were performed using an existing MLP 2×2 dual DAP package. The results of the calculations are shown in Table 1 below.

TABLE 1

| Die Size (mils²) | Substrate | Active Area | Rdson (mΩ) −4.5 V | | Rdson (mΩ) −2.5 V | |
|---|---|---|---|---|---|---|
| | | | (typ) | (max) | (typ) | (max) |
| 35.5 × 24.5 | P++ | 0.00362 | (88.83) | (106.59) | (124.71) | (168.35) |
| 44.5 × 24.5 | P++ | 0.0048 | (70.1) | (84.1) | (97.3) | (131.3) |
| 35.5 × 24.5 | P+++ | 0.00318 | (60.21) | (75.87) | (92.39) | (133.96) |
| 44.5 × 24.5 | P+++ | 0.0042 | (47.63) | (60.02) | (71.72) | (104.00) |

As shown in Table 2 below, a larger die can result in approximately a 20-22% improvement in Rdson using the inventive leadframe structure described herein. Thus, embodiments of the invention provide for advantageous results that are not achieved using conventional leadframe structures.

TABLE 2

| Substrate | −4.5 V (typ) | −4.5 (max) | −2.5 V (typ) | −2.5 (max) |
|---|---|---|---|---|
| P++ | 21.11% | 21.11% | 22.01% | 22.01% |
| P+++ | 20.89% | 20.89% | 22.37% | 22.37% |

Any recitation of "a", "an" or "the" is intended to mean "one or more" unless specifically indicated to the contrary. Any recitation of "first," "second," etc., may include additional elements as well.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

Lastly, one or more features of any one or more embodiments may be combined with features from other embodiments without departing from the spirit and the scope of the invention.

What is claimed is:

1. A leadframe structure comprising:
a first leadframe structure portion comprising a first thin portion and a first thick portion, wherein the first thin portion is defined in part by a first recess; and
a second leadframe structure portion comprising a second thin portion and a second thick portion, wherein the second thin portion is defined in part by a second recess;
wherein the first thin portion faces the second recess, and the second thin portion faces the first recess, wherein a thickness of the first thin portion is less than 50% of the thickness of the first thick portion.

2. The leadframe structure of claim 1 wherein the first leadframe structure portion comprises a lead, and wherein the second leadframe structure portion comprises a die attach pad.

3. The leadframe structure of claim 1 wherein the leadframe structure comprises copper.

4. The leadframe structure of claim 1 wherein a thickness of the second thin portion is less than 50% of the thickness of the second thick portion.

5. The leadframe structure of claim 1 wherein the first recess and the second recess are formed by etching.

6. A semiconductor die package comprising:
the leadframe structure of claim 1; and
a semiconductor die mounted on the second leadframe structure portion.

7. A semiconductor die package comprising:
a leadframe structure comprising a first leadframe structure portion comprising a first thin portion and a first thick portion, wherein the first thin portion is defined in part by a first recess, wherein the first leadframe structure portion is a lead, and a second leadframe structure portion comprising a second thin portion and a second thick portion, wherein the second thin portion is defined in part by a second recess, and wherein the second leadframe structure portion is a die attach pad, wherein the first thin portion faces the second recess, and the second thin portion faces the first recess, wherein a thickness of the first thin portion is less than 50% of the thickness of the first thick portion;
a semiconductor die on the die attach pad; and
a molding material formed around at least part of the leadframe structure and the semiconductor die.

8. The semiconductor die package of claim 7 wherein the semiconductor die comprises a power transistor.

9. The semiconductor die package of claim 7 wherein the semiconductor die comprises a vertical power transistor.

10. The semiconductor die package of claim 7 further comprising a wirebond formed between the semiconductor die and the lead.

11. An electrical assembly comprising the semiconductor die package of claim 10.

12. The leadframe structure of claim 1 wherein the first leadframe structure portion includes a first surface and a second surface opposite the first surface, where the first surface of the first leadframe structure portion and the second surface of the first leadframe structure portion define the first thick portion, and wherein the first thin portion is also defined in part by the second surface of the first leadframe structure portion.

13. The leadframe structure of claim 12 wherein the second leadframe structure portion includes a first surface and a second surface opposite the first surface, where the first surface of the second leadframe structure portion and the second surface of the second leadframe structure portion define the second thick portion, and wherein the second thin portion is also defined by the first surface of the second leadframe structure portion.

14. The leadframe structure of claim 13 wherein the first thick portion and the second thick portion have the same thickness.

15. The leadframe structure of claim 14 wherein a distance between the first thin portion and the second thin portion is about 50% of the thickness of the first thick portion.

16. The leadframe structure of claim 1 wherein lengths of the first thin portion and the second thin portion are less than 20 mils.

17. A leadframe structure comprising:
a first leadframe structure portion comprising a first thin portion and a first thick portion, wherein the first thin portion is defined in part by a first recess; and
a second leadframe structure portion comprising a second thin portion and a second thick portion, wherein the second thin portion is defined in part by a second recess;
wherein the first thin portion faces the second recess, and the second thin portion faces the first recess, wherein the first thin portion and the second thin portion vertically overlap with respect to each other, but are electrically isolated from each other.

18. The electrical assembly of claim 11 further comprising a circuit substrate; and the semiconductor die package mounted to the circuit substrate.

19. The leadframe structure of claim 17 wherein the leadframe structure consists of copper.

20. The leadframe structure of claim 17 wherein the first leadframe structure portion comprises a lead, and wherein the second leadframe structure portion comprises a die attach pad.

21. The leadframe structure of claim 17 wherein the leadframe structure comprises copper.

22. The leadframe structure of claim 17 wherein a thickness of the first thin portion is less than 50% of the thickness of the first thick portion.

23. The leadframe structure of claim 17 wherein a thickness of the second thin portion is less than 50% of the thickness of the second thick portion.

24. The leadframe structure of claim 17 wherein the first recess and the second recess are formed by etching.

25. A semiconductor die package comprising:
a leadframe structure comprising a first leadframe structure portion comprising a first thin portion and a first thick portion, wherein the first thin portion is defined in part by a first recess, wherein the first leadframe structure portion is a lead, and a second leadframe structure portion comprising a second thin portion and a second thick portion, wherein the second thin portion is defined in part by a second recess, and wherein the second leadframe structure portion is a die attach pad, wherein the first thin portion faces the second recess, and the second thin portion faces the first recess, wherein the first thin portion and the second thin portion vertically overlap with respect to each other, but are electrically isolated from each other;

a semiconductor die on the die attach pad; and a molding material formed around at least part of the leadframe structure and the semiconductor die.

26. The semiconductor die package of claim 25 wherein the semiconductor die comprises a vertical power MOSFET.

27. An electrical assembly comprising the semiconductor die package of claim 25.

* * * * *